United States Patent [19]

Fishkin et al.

[11] Patent Number: 5,047,648
[45] Date of Patent: Sep. 10, 1991

[54] METHOD AND APPARATUS FOR DETECTING PARTICLES IN ION IMPLANTATION MACHINES

[75] Inventors: Boris Fishkin, San Jose; Michael Current, Mountain View, both of Calif.

[73] Assignee: Applied Materials, Inc., Santa Clara, Calif.

[21] Appl. No.: 618,019

[22] Filed: Nov. 26, 1990

Related U.S. Application Data

[63] Continuation of Ser. No. 513,329, Apr. 20, 1990, abandoned.

[51] Int. Cl.⁵ .............................................. H01J 37/244
[52] U.S. Cl. ................................. 250/492.2; 250/397; 250/492.3
[58] Field of Search ................. 250/492.2, 397, 492.21, 250/492.23, 492.3, 309

[56] References Cited

U.S. PATENT DOCUMENTS

| | | | |
|---|---|---|---|
| 4,733,091 | 3/1988 | Robinson | 250/492.2 |
| 4,804,853 | 2/1989 | Borden | 250/574 |
| 4,910,399 | 3/1990 | Taira et al. | 250/397 |
| 4,931,650 | 6/1990 | Lowe et al. | 250/397 |

OTHER PUBLICATIONS

W. Weisenberger et al., Real-Time In-Situ Particle Monitoring in a High Current Ion Implantation Production Bay, Nuclear Instruments and Methods in Physics Research B37/38 (1989) pp. 644-648.

"PM-100 In-Situ Particle Flux Monitor", High Yield Technology, Inc.

"In-Situ Particle Monitoring in the Varian 120-10, End Station", by Vanmoorleghem et al.

Primary Examiner—Jack I. Berman
Assistant Examiner—Kiet T. Nguyen
Attorney, Agent, or Firm—Paul L. Hickman

[57] ABSTRACT

A method for detecting particles in an ion implantation characterized by the steps of placing a particle sensor within the vacuum chamber of the ion implantation machine, exposing the substrate to an ion beam, thereby dislodging a stream of free particles, and detecting a portion of the free particle sensor. The particle sensor is preferably shielded from radiation to prevent false readings, and is positioned substantially along the plane of rotation of a substrate support wheel. By positioning the particle counter both along the plane of rotation and tangential to the rotation of the wheel at the point of ion impact, the particle counter intercepts the particle stream at the point of maximum particle flux. The apparatus includes a laser beam, a photodetector responsive to a portion of the laser beam scattered off of particles in the particle stream and a lead shield to shield the photodetector from x-rays generated within the vacuum chamber of the ion implantation machine.

12 Claims, 3 Drawing Sheets

METHOD AND APPARATUS FOR DETECTING PARTICLES IN ION IMPLANTATION MACHINES

This is a continuation of copending application Ser. No. 07/513,329 filed on Apr. 20, 1990, now abandoned.

BACKGROUND OF THE INVENTION

This invention relates generally to ion implantation machines used to process integrated circuit wafers and more particularly to methods and apparatus used to measure particulate contamination of wafers processed in such machines.

Ion implantation machines can be used to selectively implant impurities into semiconductor wafers to vary their electrical properties. This is accomplished by forming an energetic beam of ions of a desired impurity, such as boron or phosphorus, and directing the beam to the wafer surface. Unfortunately, the ion beam can transport particulates from the beam line to the wafer surface thereby causing particulate contamination of the wafer. With the continuing trend towards larger integrated circuits and smaller chip geometries, even small (e.g. submicron) sized particles can shadow a surface of the wafer and prevent ion implantation beneath the particle. This can, of course, adversely effect the ultimate yield of the implanted wafer. Therefore, the monitoring of particulate generation caused by ion implantation is of critical concern to semiconductor process engineers.

The number of "killer particles" on a wafer can be determined by inspection of the wafer after it has been processed within the ion implantation machine. However, it is far more desirable to obtain an indication of the particle level within the ion implantation machine while the wafers are still being processed so that trouble points during the process can be isolated and so that possible corrective actions can be taken.

High Yield Technology, Inc. of Sunnyvale, Calif. markets an in-situ particle flux monitor as model PM-150 which can be mounted in the load-lock, exhaust line, or vacuum chamber of an ion implantation machine. In a paper entitled "Real-Time, In-Situ Particle Monitoring in a High Current Ion Implantation Production Bay" by Weisenberger et al., *Proceeding of the Seventh International Conference on Ion Implantation Technology*, Kyoto, Japan, June 7, 1988, the use of a High Yield Technology PM-150 monitor within the end station of a Varian ion implantation machine is described. While some positive results were reported, the actual number of particles detected by the PM-150 within the Varian ion implantation machine was low due to the low concentration of particulates at the sensing aperture of the monitor and due to the relatively low sensitivity and response time of the PM-150 monitor.

A partial solution to the above problem might be to substitute a higher speed, more sensitive monitor for the PM-150. However, such monitors are not readily commercially available and, if they were, would suffer a sensitivity to x-rays generated by the impingement of the ion beam on surfaces within the vacuum chamber of the ion implantation machine. In consequence, the prior art does not disclose a sensitive, reliable particle detector which can be placed within the vacuum chamber of an ion implantation machine.

SUMMARY OF THE INVENTION

It is therefore an object of the present invention to provide an in-situ method and apparatus for monitoring particles within an ion implantation machine which reliably detects far more particles than the in-situ methods and apparatus of the prior art.

The method for monitoring particles includes the step of exposing a substrate within a vacuum chamber to an ion beam by rotating the substrate within a plane of rotation past an ion beam aperture, thereby dislodging free particles as the ion beam impinges on the substrate, and disposing a particle sensor within the vacuum chamber substantially along the plane of rotation to detect a portion of the free particles. The particle sensor is preferably highly sensitive but is shielded by lead shielding from x-rays generated within the ion implantation machine. The preferred location of the particle detector is tangential to the direction of rotation of the wafer taken from the point of impact of the ion beam on the wafer. At this position, the particle flux density of the particle stream generated by the ion beam will be at a maximum.

The apparatus of the present invention includes a particle sensing mechanism capable of functioning in a low-pressure environment, and a shield for protecting the particle sensing mechanism from x-rays. The particle sensing mechanism is disposed within an enclosure having an aperture substantially aligned with the maximum particle flux density portion of the particle stream. The sensing mechanism includes a solid state laser for developing a laser beam which is scattered by the particles in the particle stream, a photodetector which detects the scattered light, and detection circuitry coupled to the photodetector and operative to develop a particle count.

An advantage of the present invention is that the particle detector is located in the position of maximum particle flux density, ensuring a high, statistically accurate particle count. Another advantage of the present invention is that radiation shielding is provided allowing the use of higher speed and more sensitive particle detectors.

These and other advantages of the present invention will become clear to those skilled in the art upon a study of the detailed description of the invention and of the several figures of the drawings.

DETAILED DESCRIPTION OF THE PREFERRED EMBODIMENTS

Figure 1:
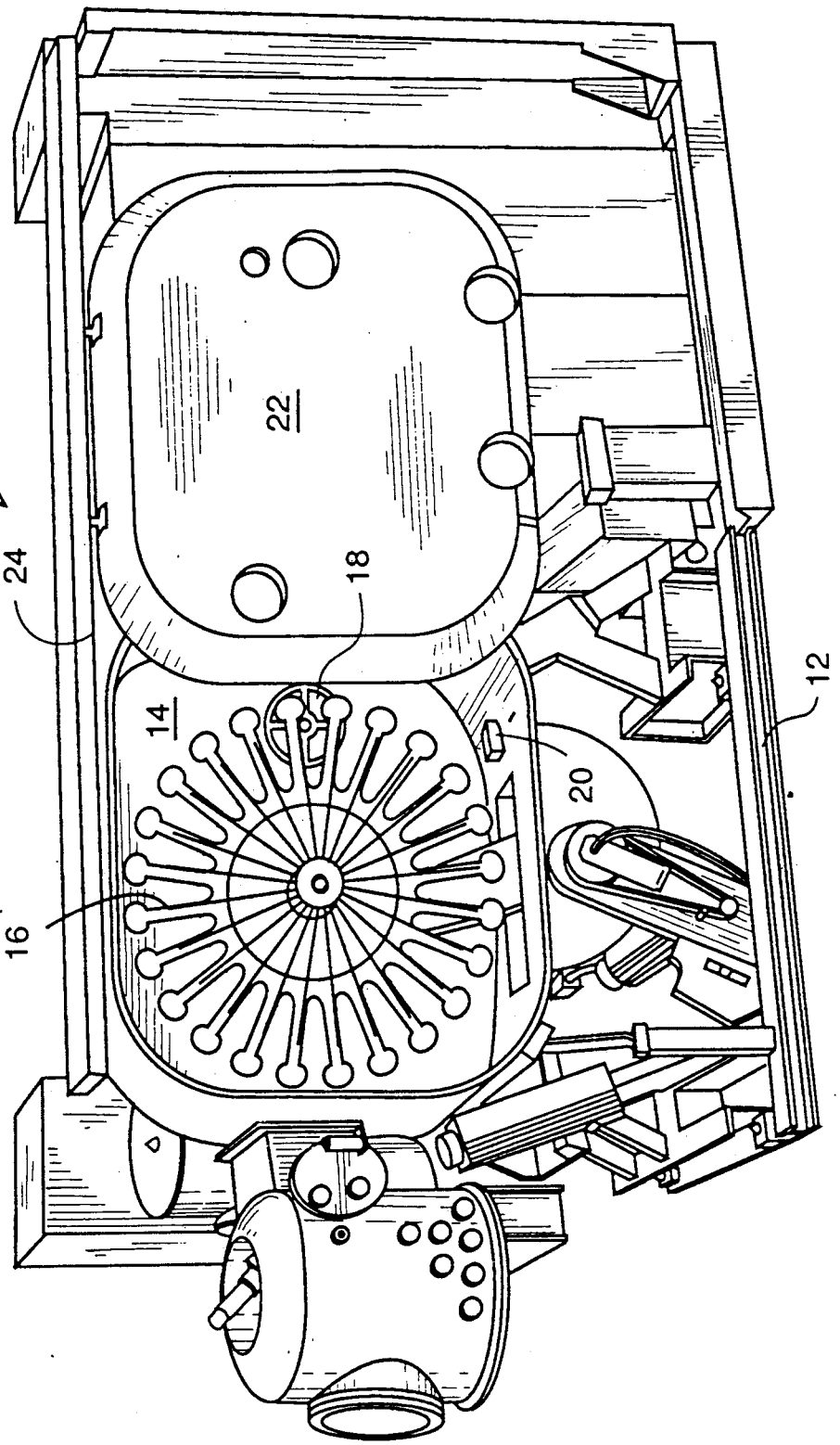
FIG. 1 is a perspective view of an ion implantation machine provided with a particle detector in accordance with the present invention.

In FIG. 1, an ion implantation machine 10 includes a frame 12, a vacuum chamber 14, an ion implantation wheel 16, an ion beam aperture 18 and a particle detector 20. The vacuum chamber may be sealed by a door 22 which is guided by an overhead track 24. A description of the structure and use of ion implantation machine 10, absent the particle detector 20, is found in U.S. Pat. No. 4,733,091 issued Mar. 22, 1988 to Robinson et al., assigned to the assignee of the present invention and incorporated herein by reference.

Figure 2:
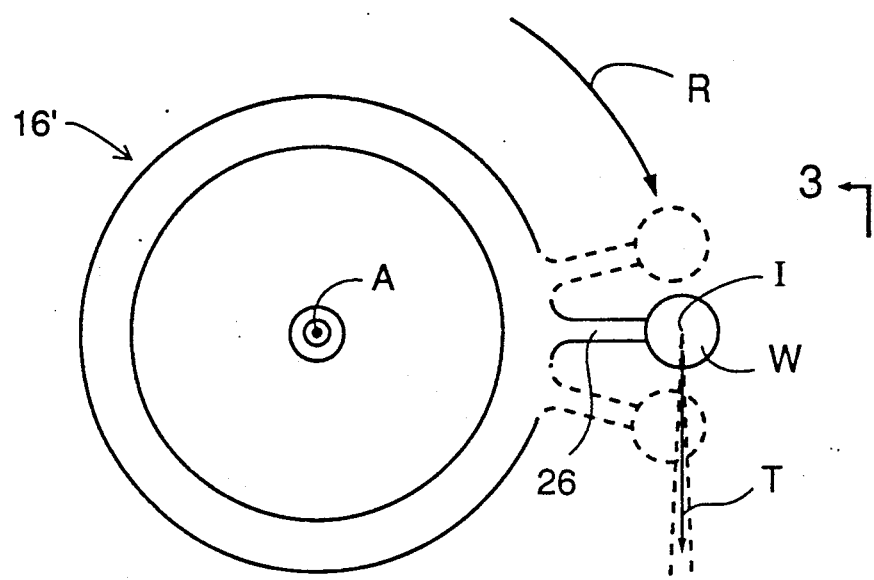
FIG. 2 is a pictorial view, taken in elevation, illustrating the formation of a particle stream S and the placement of the particle detector.

In FIG. 2, the ion implantation wheel is shown in a partial pictorial view at 16'. It should be noted that view of the wheel 16' is taken from the opposite side as the view of the wheel 16 in FIG. 1. The wheel 16' has an axis A of rotation and rotates with a circular motion around the axis A in a rotatory path R. A semiconductor wafer W (or any other substrate to be implanted) is held on an arm 26 of the wheel 16'. When an ion beam exiting from ion beam aperture 18 impinges upon wafer W as illustrated by the point I, a stream S of free particles are generated. Since the wafer W is rotating along rotatory path R, the stream S of free particles have a momentum which tends to carry them in a direction substantially tangential to rotary path R from the point that they are dislodged from the wafer W by the ion beam. The particle detector 20 is advantageously positioned to intercept a high particulate flux density portion of the stream S of particles.

Figure 3:
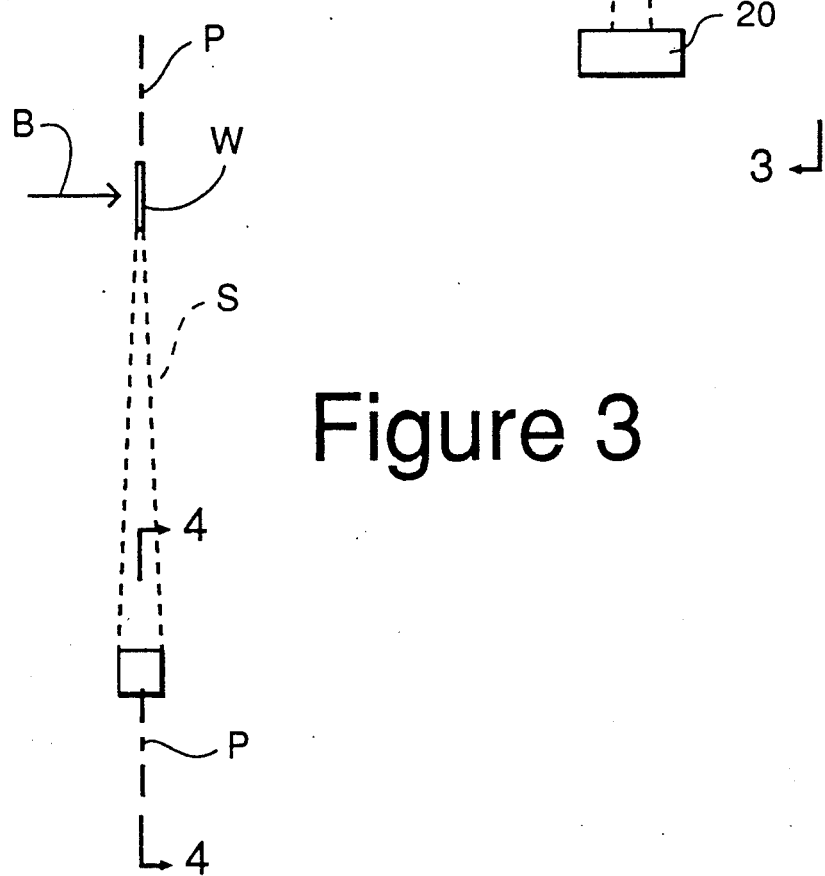
FIG. 3 is pictorial view, also in elevation, taken along line 3—3 of FIG. 2.

This concept is further illustrated in FIG. 3 which is a view taken along line 3—3 of FIG. 2. When an ion beam B impinges upon wafer W a stream S of free particles is formed. This stream S tends to be concentrated along the plane P of the rotation of the wheel 16' and the wafer W. Of course, the stream S is not as nicely shaped and defined as is illustrated in FIGS. 2 and 3 in that some free particles will be released after the B impinges on the wafer W, some charged particles will interact electrically with other charged particles and some particles will have momentum away from the plane P. However, it has been found by inspection of the interior of the vacuum chamber 14 that the preponderance of particles tend to impinge upon the vacuum chamber walls close to the plane P of rotation of the wheel 16' and that the greatest concentration of particles appears to be along a tangent T on plane P taken from the point I of ion implantation. Therefore, by aligning the particle detector 20 with the ion beam aperture 18 along the tangent T to the rotary path R the number of particles in stream S which impinge upon the particle detector 20 can be maximized.

Figure 4:
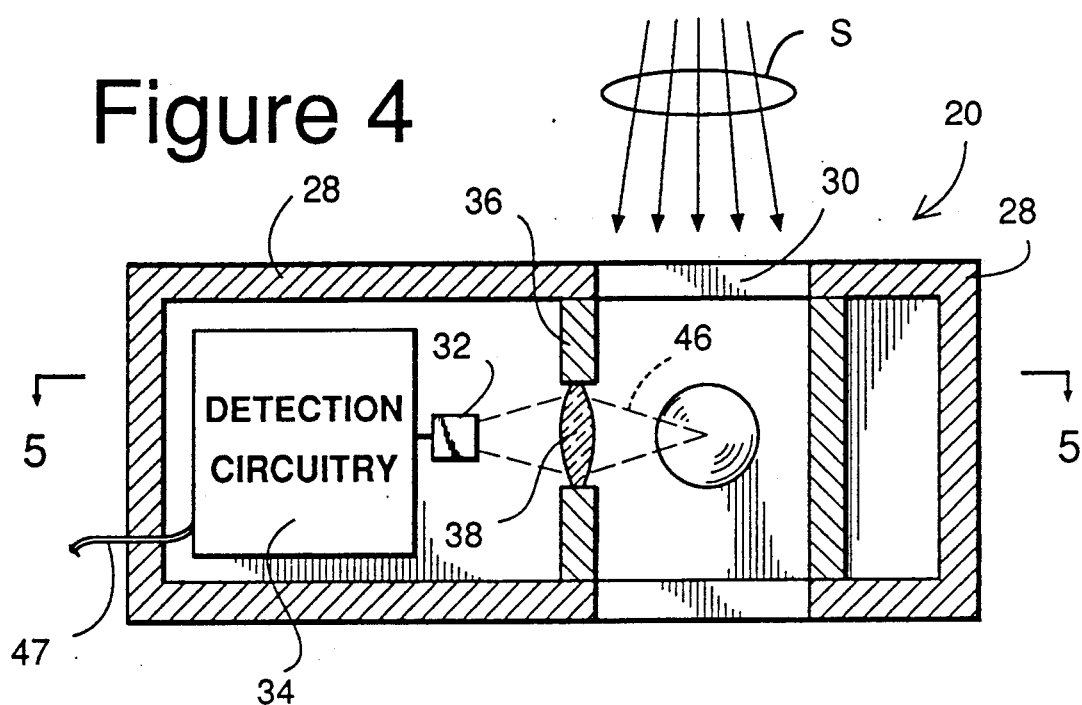
FIG. 4 is a cross-sectional view of the particle detector taken along line 4—4 of FIG. 3.
Figure 5:
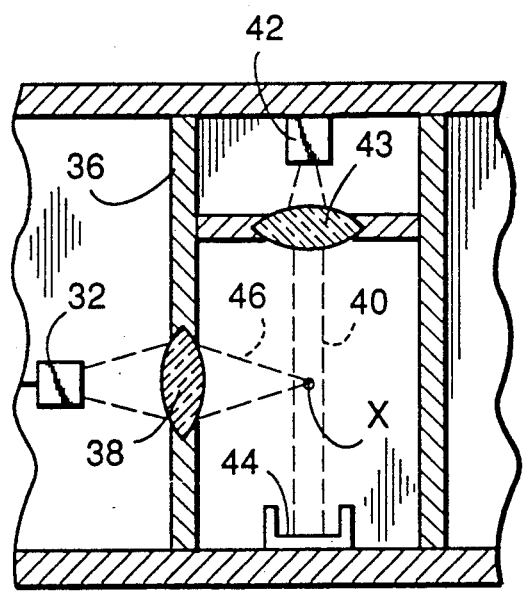
FIG. 5 is a cross-sectional view of the particle detector taken along line 5—5 of FIG. 4.

In FIGS. 4 and 5 the preferred particle detector 20 of the present invention is shown in greater detail. It should be noted, however, that there are commercially available particle detectors which are also suitable for use in the present invention such as the aforementioned model PM-150 of High Yield Technology, Inc. The particle detector 20 of the present invention includes enclosure walls 28 having an aperture 30 aligned with the stream S of free particles. A photodetector 32 and detection circuitry 34 are positioned behind an opaque barrier wall 36 which only permits light to enter via optics 38. A laser beam 40 is generated by a solid state laser 42, shaped by optics 43 and is ultimately absorbed within a light trap 44. When the laser beam 40 impinges on a particle X from the stream S, some of the laser beam 40 is scattered as illustrated at 46 and is focussed by optics 38 on photodetector 32. The detection circuitry 34 amplifies and analyzes the signal produced by photodetector 32 an provides a digital and/or analog particle output signal on a line 46.

The enclosure walls 28 are preferably made from a radiation-blocking material such as lead or heavy steel when using high-speed, sensitive particle detectors of the type described above. As mentioned previously, such shielding is desirable because the operation of the ion implantation machine tends to create radiation within the vacuum chamber 14 such x-rays. While low energy radiation is easily blocked by walls 28 made of virtually any material, the more energetic x-rays generated within the vacuum chamber can penetrate thin walls and impinge upon photodetector 32 to create false particle readings. It has been found that a ⅛ inch thick wall 28 of lead will stop the majority of such high-energy radiation, providing a more reliable particle count.

Of course, the particle count on line 46 of particle detector 20 is only a fraction of the total particles generated within the system. This is due in great part due to the limited size of aperture 30 relative to the total plane P along which the particles tend to be concentrated. The particle detector also tends to miss particles not generated by the impingement of the ion beam on a wafer W or wheel 16', such as particles generated by the ion beam hitting a beam trap (not shown) and particles generated by other means such as friction between moving parts of the apparatus. However, the placement of the particle detector 20 along the tangent T and plane P has two important advantages, namely: (1) that the particle stream S tends to be of maximum flux density along the tangent T providing far more statistically accurate particle counts; and (2) the particles detected at this position tend to be functionally related to the ultimate particulate contamination of the wafer W. In other words, the placement of the particle detector 20 at the disclosed location permits accurate, in-situ, on-the-fly prediction of the actual level of particulate contamination of the wafers being processed within the ion implantation machine 10.

While this invention has been described in terms of several preferred embodiments, it is contemplated that various alterations and permutations thereof will become apparent to those skilled in the art. It is therefore intended that the appended claims include all such alterations and permutations as fall within the true spirit and scope of the present invention.

What is claimed is:

1. A method for detecting particles in an ion implantation machine comprising the steps of:

exposing a substrate positioned within a vacuum chamber to an ion beam by rotating said substrate within a plane of rotation past an ion beam aperture, where the impingement of said ion beam on said substrate dislodges free particles; and disposing particle sensing means within said vacuum chamber substantially within said plane of rotation to detect a portion of said free particles.

2. A method for detecting particles in an ion implantation machine as recited in claim 1 further comprising the step of:

shielding said particle sensing means from radiation.

3. A method for detecting particles in an ion implantation machine as recited in claim 1 wherein said particle sensing means is disposed along a line which includes a point of ion impingement on said substrate and which is substantially tangential to a rotary path of said substrate within said plane of rotation.

4. A method for detecting particles in an ion implantation machine as recited in claim 3 further comprising the steps of:

shielding said particle sensing means from radiation.

5. An ion implantation machine and particle detection apparatus comprising:

a vacuum chamber;

rotatable support means disposed within said vacuum chamber, said rotatable support means having a plane of rotation;

ion beam generating means having an ion beam aperture;

means for supporting at least one substrate on said rotatable support means such that said substrate may be caused to move past said ion beam aperture, thereby dislodging free particles when an ion beam impinges upon said substrate; and particle sensing means disposed within said vacuum chamber substantially within said plane of rotation for detecting some of said free particles.

6. An ion implantation machine and particle detection apparatus as recited in claim 5 wherein said particle sensing means is shielded from radiation.

7. An ion implantation machine and particle detection apparatus as recited in claim 5 wherein said particle sensing means is substantially aligned with said ion beam aperture.

8. An ion implantation machine and particle detection apparatus as recited in claim 5 wherein said particle sensing means is disposed along a line which includes a point of ion impingement on said substrate and which is substantially tangential to a rotary path of said substrate within said plane of rotation.

9. An ion implantation machine and particle detection apparatus as recited in claim 5 wherein said particle sensing means is shielded from radiation.

10. An apparatus for detecting particles within an ion implantation machine vacuum chamber comprising:

particle sensing means including a sensing aperture which is substantially aligned with a particle stream comprising dislodged free particles generated by the impingement of an ion beam with a substrate; and shielding means substantially enclosing said particle sensing means to shield said particle sensing means from high-energy radiation.

11. An apparatus for detecting particles within an ion implantation machine vacuum chamber as recited in claim 10 wherein said particle sensing means includes laser means producing a laser beam aligned with said aperture and photodetector means shielded by said shielding means and responsive to a portion of said laser beam which has been scattered by particles through said aperture.

12. An apparatus for detecting particles within an ion implantation machine vacuum chamber as recited in claim 11 wherein said particle sensing means further comprising detection circuitry means coupled to said photodetector means to produce a particle output signal.

* * * * *